United States Patent
Lund et al.

(10) Patent No.: US 9,054,685 B2
(45) Date of Patent: Jun. 9, 2015

(54) PROGRAMMABLE BUS SIGNAL HOLD TIME WITHOUT SYSTEM CLOCK

(71) Applicant: Atmel Corporation, San Jose, CA (US)

(72) Inventors: Morten Lund, Tiller (NO); Ian Fullerton, Tiller (NO)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/873,013

(22) Filed: Apr. 29, 2013

(65) Prior Publication Data
US 2014/0320189 A1   Oct. 30, 2014

(51) Int. Cl.
*H03H 11/26*   (2006.01)
*H03K 5/13*   (2014.01)

(52) U.S. Cl.
CPC ........................................ *H03K 5/131* (2013.01)

(58) Field of Classification Search
USPC ......... 327/261, 263–265, 268–274, 276–279, 327/283–286, 290–292, 199; 716/6; 326/46; 713/500, 600; 710/100, 110
See application file for complete search history.

(56) References Cited

U.S. PATENT DOCUMENTS

| | | | | |
|---|---|---|---|---|
| 4,172,998 A | * | 10/1979 | Beling et al. | 307/650 |
| 5,343,301 A | * | 8/1994 | Wesolowski | 348/500 |
| 6,275,077 B1 | * | 8/2001 | Tobin et al. | 327/108 |
| 6,483,381 B1 | * | 11/2002 | Shau | 329/317 |
| 6,560,716 B1 | * | 5/2003 | Gasparik et al. | 713/600 |
| 6,670,831 B2 | * | 12/2003 | Mashimo | 327/34 |
| 7,227,398 B2 | * | 6/2007 | Rosen | 327/292 |
| 7,728,642 B1 | * | 6/2010 | O'Dwyer | 327/265 |
| 7,786,782 B2 | * | 8/2010 | Lien et al. | 327/175 |
| 7,795,939 B2 | * | 9/2010 | Chen et al. | 327/199 |
| 8,013,654 B1 | * | 9/2011 | Chen et al. | 327/261 |
| 2007/0096836 A1 | * | 5/2007 | Lee et al. | 331/57 |
| 2010/0134169 A1 | * | 6/2010 | Okubo | 327/263 |

\* cited by examiner

*Primary Examiner* — Lincoln Donovan
*Assistant Examiner* — Thomas Skibinski
(74) *Attorney, Agent, or Firm* — Fish & Richardson P.C.

(57) ABSTRACT

A circuit is disclosed that provides a programmable hold time for a bus signal without running a system clock and without a frequency requirement between the system clock and a bus clock.

14 Claims, 3 Drawing Sheets

PROGRAMMABLE BUS SIGNAL HOLD TIME WITHOUT SYSTEM CLOCK

TECHNICAL FIELD

This disclosure relates generally to generating bus signals compliant with bus protocol.

BACKGROUND

Inter-Integrated Circuit (I²C) is a multi-master, serial, single-ended computer bus used for attaching low-speed peripherals to a motherboard, embedded system, mobile device or other electronic device. I²C uses two bidirectional open-drain lines, Serial Data Line (SDA) and Serial Clock (SCL), pulled up with resistors. Nodes on the bus can have a master or slave role.

I²C defines three basic types of messages, each of which begins with START and ends with STOP. These messages include: 1) single message where a master writes data to a slave; 2) single message where a master reads data from a slave; and 3) combined messages, where a master issues at least two reads and/or writes to one or more slaves.

System Management Bus (SMBus) is a single-ended two-wire bus derived from I²C serial bus protocol. The SMBus protocols are a subset of the data transfer formats defined in the I²C specifications. SMBus specifies that there must be a minimum hold time of 300 ns from the falling edge of SCL to data change SDA. This condition must be true for each bit in a transaction.

A common method used to generate a minimum hold time is to have a system clock run fast enough to synchronize SCL and provide a hold time using a counter. The drawbacks are that the system clock must run fast enough to provide the desired hold time.

SUMMARY

A circuit is disclosed that provides a programmable hold time for a bus signal without running a system clock and without a frequency requirement between the system clock and a bus clock.

In some implementations, a circuit for implementing a programmable hold time for a bus signal comprises: a latch configured to hold a bus data signal at the output of the latch; a latch control coupled to the latch and configured to set the latch according to a bus clock signal and to reset the latch according to a reset signal; and a delay counter coupled to the latch control and configured to count a number of delays according to a programmed delay value, the delay counter further configured to generate the reset signal based on the number of delays counted.

Particular implementations of the programmable hold time circuit disclosed herein provide one or more of the following advantages: 1) no requirement for a running a system clock; and 2) no requirement for a bus clock to system clock ratio.

DETAILED DESCRIPTION

Figure 1:
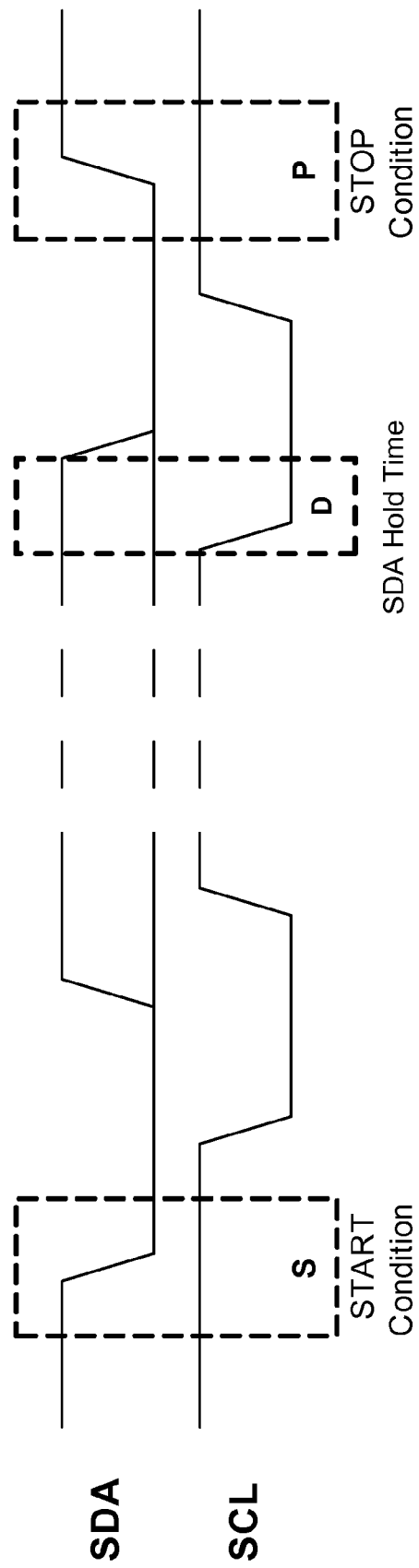
FIG. 1 is a timing diagram illustrating hold time for a bus data signal (SDA) according to SMBus protocol.

FIG. 1 is a timing diagram illustrating hold time for a bus data signal (SDA) according to SMBus protocol. A START condition S is denoted by a high to low transition on SDA while SCL is high, and the STOP condition P is denoted by a low to high transition on SDA while SCL is high. SMBus protocol specifies that there must be a minimum hold time D of 300 ns from the falling edge of SCL to data change SDA, which must be true for each bit in a transaction.

Figure 2:
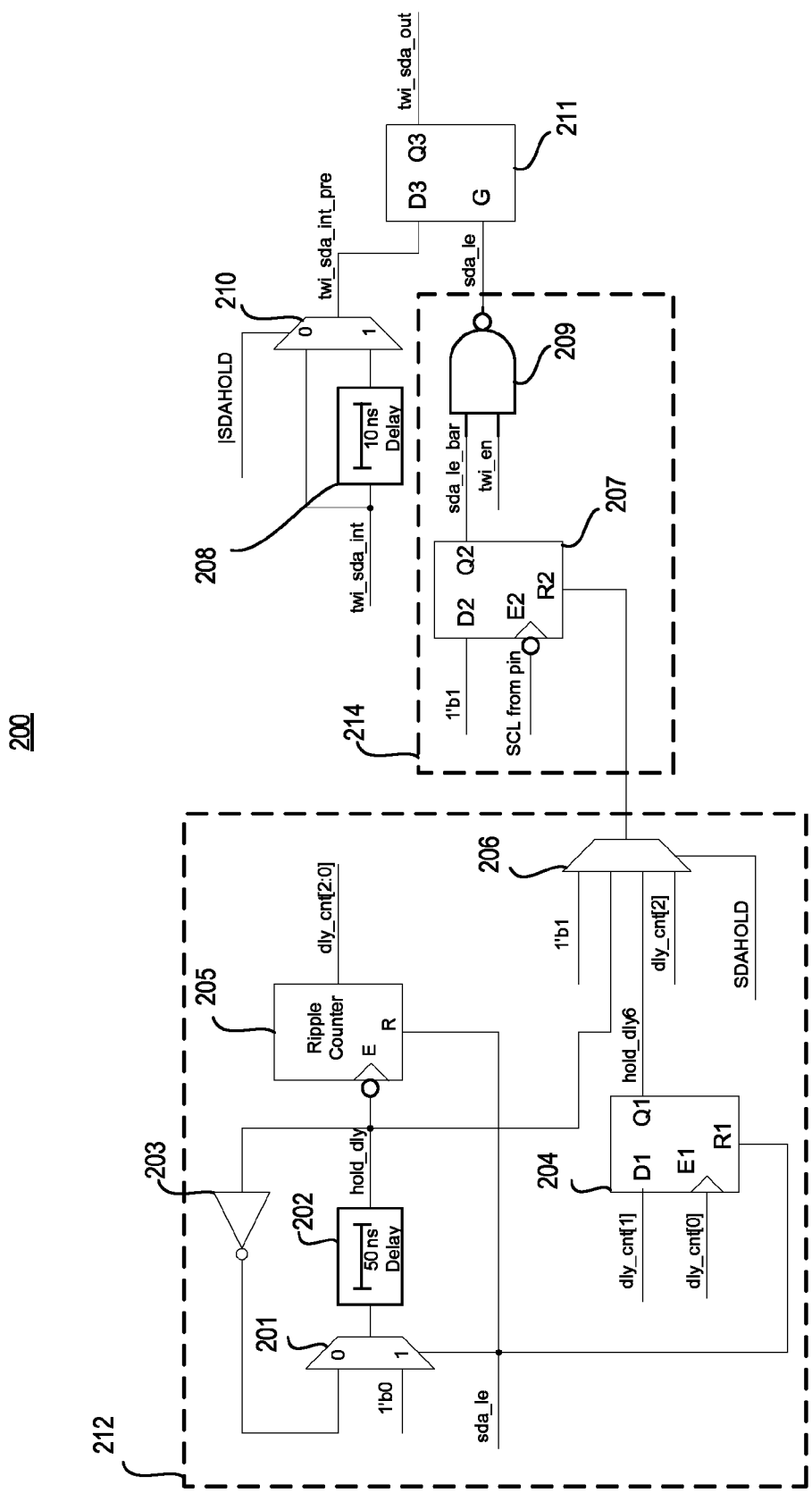
FIG. 2 is a schematic diagram of an example circuit for generating a programmable hold time without using a system clock.

FIG. 2 is a schematic diagram of example circuit 200 for generating a programmable hold time without using a system clock. Although circuit 200 is described as holding the SMBus data signal SDA, circuit 200 can also be used to generate programmable hold times for any bus signals used in any bus protocols where a programmable hold time is desirable.

In some implementations, circuit 200 can include latch 211, delay counter 212 and latch control 214. Latch 211 is implemented using a flip-flop configured to operate as a latch. Latch 211 can include data input D3 coupled to multiplexer 210 and gate input G coupled to latch control 214. A second input of multiplexer 210 is coupled to the output of delay element 208. The input of delay element 208 and the first input of multiplexer 210 are each coupled to SDA (twi_sda_int). Based on the result of a Boolean OR of the programmed bits SDAHOLD (e.g., 2-bits), one of twi_sda_int or twi_sda_int_pre (SDA delayed by 10 ns) is coupled to D input of latch 211. In this example, we assume that SDAHOLD=11 for a maximum hold time of 400 ns. Setting SDAHOLD=11, we have |SDAHOLD=1, resulting in twi_sda_int_pre being coupled to D3 input of latch 211. Note that the symbol "|" means Boolean OR, which can be implemented by an OR gate.

In some implementations, delay counter 212 can include multiplexers 201, 206, delay element 202, ripple counter 205, sequential logic 204 (e.g., a D flip-flop) and inverter 203. Multiplexer 201 can have a first input coupled to the output of inverter 203 and a second input coupled to a logic low value (1'b0), which can be ground. One of the first and second inputs of multiplexer 201 is selected by the output of latch control 214 (sda_le). The output of multiplexer 201 is coupled to the input of delay element 202. The output of delay element 202 (hold_dly) is coupled to the clock input E of ripple counter 205 and to the input of inverter 203.

Figure 3:
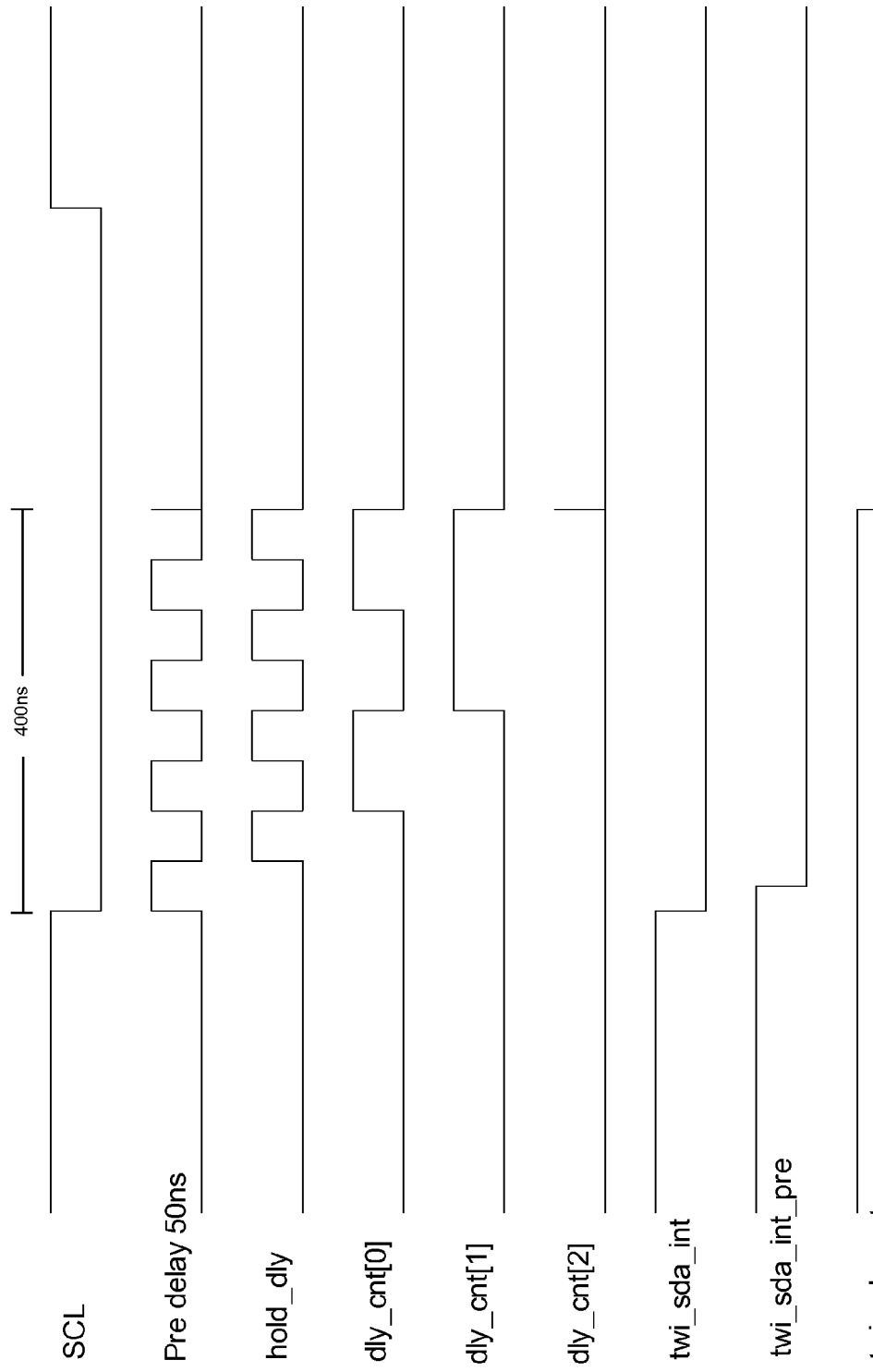
FIG. 3 illustrates waveforms generated by the circuit of FIG. 2 for a maximum programmable hold time.

The output of ripple counter 205 is a 3-element array dly_cnt [2:0]. dly_cnt [2:0] can take on values: 000, 001, 010 and 100 over four cycles, as illustrated in FIG. 3. Ripple counter 205 is an asynchronous ripple counter constructed from sequential logic (e.g., flip-flops) using techniques known in the art. The elements dly_cnt[0] and dly_cnt[1] are coupled to clock input E1 and data input D1, respectively, of sequential logic 204.

Multiplexer 206 has a first input coupled to a logic high value (1'b1), a second input coupled to the output of delay element 202, a third input coupled to the output of sequential logic 204 (hold_dly6) and a fourth input coupled to dly_cnt [2]. One of the inputs of multiplexer 206 is selected based on SDAHOLD. In this example, SDAHOLD=11, resulting in the fourth input (dly_cnt[2]=1 for maximum hold time or 400 ns) being output from multiplexer 206. The output of multiplexer 206 is coupled to latch control 214, where it is used to enable latch 211. In this example, dly_cnt[2]=1 after the maximum delay of 400 ns is reached, causing latch 211 input D3 to propagate to Q3.

Latch control 214 can include sequential logic 207 (e.g., a D flip-flop) and combinational logic 209 (e.g., a NAND gate).

The clock input E2 of sequential logic 207 is coupled to bus clock SCL (note the inverted input). The data input D2 of sequential logic 207 is coupled to a logic high value (1'b1). The output Q2 of sequential logic 207 is coupled to first input of NAND gate 209. The second input of NAND gate 209 is coupled to twi_en, which is an enable signal that can be generated by another component (e.g., a microprocessor).

As described above, SDAHOLD is an n-bit value programmed by the user that determines the number of delay cycles. For example, SDAHOLD can be 2 bits that can be programmed as 00, 01, 10 and 11, where the amount of delay increases from 00 to 11. When SDAHOLD=0 ("00") or twi_en=0, sda_le is always high and circuit 200 is disabled. The 50 ns delay element 202 is expensive, and for this reason, it is used to create an oscillating loop with a 100 ns nominal period. The output (hold_dly) is used to clock ripple counter 205.

When circuit 200 is enabled and SCL goes low, sda_le is low for a number of delay cycles determined by SDAHOLD. After delaying for the number of delay cycles determined by SDAHOLD, latch 211 opens and SDA (twi_sda_int_pre) propagates through latch 211. When circuit 200 is disabled, sda_le is always high and SDA propagates immediately.

FIG. 3 illustrates waveforms generated by circuit of FIG. 2 for a maximum programmable SDA hold time of 400 ns (SDAHOLD=11). In this example, the 50 ns delay loop is activated on the negative edge of SCL. Ripple counter 205 counts until dly_cnt[2]=1, then latch 211 opens and circuit 200 is reset. In this way, the time between the falling edge of SCL and data change on SDA (twi_sda_out) is programmable without a running system clock.

Referring to the waveforms shown in FIG. 3, when SCL goes low, and after a pre delay of 50 ns, ripple counter 205 starts to count delay cycles. Ripple counter 205 counts over four delays cycles, resulting in dly_cnt[2:0] storing the 3-bit values: 000, 001, 010, 100, as shown in FIG. 3. While ripple counter 205 is counting delay cycles, twi_sda_int=0 and twi_sda_int_pre=0. Additionally, twi_sda_out=1, representing no data change on SDA. When dly_cnt[2] is set or 1 after 400 ns, twi_sda_out goes low representing a data change on SDA.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A circuit comprising:
   a latch configured to hold a bus data signal of a bus at an output of the latch;
   a latch control coupled to the latch and configured to close the latch according to a bus clock signal and to open the latch according to a reset signal, where the bus clock signal is generated by a clock source that is external to the circuit; and
   a delay counter coupled to the latch control and configured to count a number of delays according to a programmed delay value, the delay counter further configured to generate the reset signal for the latch control based on the number of delays counted.

2. The circuit of claim 1, where the bus is a System Management Bus (SMBus), the bus data signal is Serial Data Line (SDA) and the bus clock signal is Serial Clock (SCL).

3. The circuit of claim 1, where the latch control comprises:
   first asynchronous sequential logic having a first input coupled to the bus clock signal, a second input coupled to a logic high value and an output coupled to a gate input of the latch.

4. The circuit of claim 3, where the output of the first asynchronous sequential logic is coupled to a gate of the latch through combinational logic.

5. The circuit of claim 3, further comprising:
   a first delay element; and
   a multiplexer having a first input coupled to the bus data signal, a second input coupled to the first delay element, and an output of the multiplexer coupled to a data input of the latch.

6. The circuit of claim 5, where the first delay element provides at least 10 nanoseconds of delay.

7. The circuit of claim 5, where the delay counter comprises:
   a second delay element;
   a ripple counter having a clock input and a reset input, where the clock input is coupled to an output of the second delay element;
   an inverter having an input coupled to the output of the second delay element; and
   a multiplexer having a first input coupled to a logic low signal and a second input coupled to an output of the inverter, the multiplexer further coupled to the bus data signal for selecting one of the multiplexer inputs to couple to the clock input of the ripple counter.

8. The circuit of claim 7, further comprising:
   second asynchronous sequential logic coupled to a third input of the multiplexer, the second asynchronous sequential logic having a first input coupled to a first output value of the counter and a second input coupled to a second output value of the counter.

9. The circuit of claim 8, where a fourth input of the multiplexer is coupled to third output value of the counter.

10. The circuit of claim 8, where the first and second asynchronous logic include flip-flops.

11. The circuit of claim 7, where the second delay element provides at least 50 nanoseconds of delay.

12. The circuit of claim 7, where the first and second delay elements include inverter chains or resistive-capacitive (RC) time delay circuits.

13. The circuit of claim 1, where the programmed delay value includes n-bits, where n is a positive integer greater than or equal to two.

14. The circuit of claim 1, where the delay counter further comprises
   a ripple counter configured to generate a plurality of delays; and
   a multiplexer coupled to the ripple counter and configured to select one of the plurality of delays as the reset signal for the latch control.

* * * * *